United States Patent [19]

Blackmer et al.

[11] 4,425,551

[45] Jan. 10, 1984

[54] DIFFERENTIAL AMPLIFIER STAGE HAVING BIAS COMPENSATING MEANS

[75] Inventors: David E. Blackmer, Wilton, N.H.; David R. Welland, Boston, Mass.

[73] Assignee: DBX, Inc., Newton, Mass.

[21] Appl. No.: 247,649

[22] Filed: Mar. 26, 1981

[51] Int. Cl.³ .............................................. H03F 3/45
[52] U.S. Cl. ..................................... 330/261; 330/257
[58] Field of Search ................. 330/257, 261, 288, 259

[56] References Cited

U.S. PATENT DOCUMENTS

| | | | |
|---|---|---|---|
| 3,551,832 | 12/1970 | Graeme | 330/256 |
| 3,660,773 | 5/1972 | Free | 330/261 X |
| 3,887,879 | 6/1975 | Radovsky | 330/257 |
| 3,916,331 | 10/1975 | Schenck | 330/261 |
| 4,105,942 | 8/1978 | Henry | 330/261 |
| 4,151,483 | 4/1979 | Robe | 330/261 X |

FOREIGN PATENT DOCUMENTS

| | | |
|---|---|---|
| 1261409 | 1/1972 | United Kingdom . |
| 1297886 | 11/1972 | United Kingdom . |
| 1318709 | 5/1973 | United Kingdom . |
| 1323640 | 7/1973 | United Kingdom . |
| 1424666 | 2/1976 | United Kingdom . |
| 1451090 | 9/1976 | United Kingdom . |

Primary Examiner—James B. Mullins
Attorney, Agent, or Firm—Schiller & Pandiscio

[57] ABSTRACT

An improved amplifier of the type comprising bipolar transistor means coupled between the input terminal of the amplifier and a differential pair of transistors. Compensation means is provided for generating a compensating signal through the bipolar transistor means such that the bipolar transistor means and compensation means reduce the amount of bias current drawn from the input signal to the amplifier. Other aspects of the present invention include the provision of reducing DC offset voltages between each side of the differential amplifier due to the operation of the device with its input terminals at different voltage levels, and the provision of a zero in the transfer characteristics of the amplifier to mitigate the effects of poles provided in the transfer characteristics.

11 Claims, 3 Drawing Figures

DIFFERENTIAL AMPLIFIER STAGE HAVING BIAS COMPENSATING MEANS

The present invention relates generally to amplifiers and in particular to an amplifier requiring reduced input biasing currents from the input signal without substantially effecting high frequency performance of the amplifier.

Various amplifiers are well known for use in systems for processing electrical signals. Often such amplifiers are used in feedback systems where it is desirable to provide an input amplifier stage which will draw as little biasing current as possible from the input signal to the stage while keeping the loop transmission as high as possible in order to insure stability of the feedback system. For example, input amplifier stages for instrumentation amplifiers, operational amplifiers, as well as voltage controlled current amplifiers typically require such characteristics. Often the limiting consideration of the stability of the feedback system is the frequency response of the amplifier transistors. Where such transistors are of the bipolar type, generally the higher the collector current of such transistors the better the frequency response of the amplifier. However, increasing the collector current will increase the base current. Often base currents of such transistors are at the inputs to these amplifiers. One approach to reduce the amount of biasing current drawn from the input signal involves the use of field-effect transistors (FETs) in the amplifier, while another approach utilizes super-beta transistors in the stage. With the advent of integrated circuits (ICs), certain problems can be posed at least in some IC techniques in combining FET's and bipolar transistors on the same chip, making such a chip much more expensive to manufacture. Super-beta transistors can be difficult to manufacture since the super-beta transistors tend to be very fragile.

Accordingly, an object of the present invention is to provide an improved amplifier requiring relatively low input bias currents from the input information signal without effecting the high frequency performance of the amplifier.

Another object of the present invention is to provide an improved amplifier requiring relatively low input biasing current from the input signal without effecting high frequency performance of the amplifier and which utilizes transistors only of the bipolar type.

In addition to the foregoing, the frequency response roll-off, or transfer function of some amplifier stages of the type described herein typically includes at least one pole (a pole being defined as the value of complex frequency at which the transfer function of the circuit becomes infinite). While such poles may be useful for some applications, for other applications such poles may cause problems. For example, problems can be encountered with certain feedback configurations around the stage, such as that disclosed in our U.S. Pat. No. 4,377,792, issued Mar. 22, 1983, based on U.S. Ser. No. 387,822 filed June 14, 1982, which in turn is a continuation application of U.S. application Ser. No. 247,830 filed simultaneously herewith (and now abandoned) wherein transistors are provided in the feedback path of a stage to provide signals as a function of the logarithm of the input signal to the stage. Such a feedback configuration itself may result in a 90° phase shift. This phase shift, together with the phase shift associated with the input stage poles, is undesirable. Additionally, the amplifier is of the differential type which in some applications, can provide too much signal gain at one or more frequencies.

Another object of the present invention therefore, is to provide a predetermined frequency response of the amplifier in which the effects of any negative phase shift introduced by a pole in the feedback loop when the stage is used with a feedback configuration of the type described is reduced.

These and other objects of the present invention are achieved by an improved differential amplifier including a differential pair of transistors. In accordance with one aspect of the present invention, bipolar transistor means is coupled between the input terminal of the amplifier and the differential pair of transistors. The stage includes means for generating a compensating bias current through the bipolar transistor means so as to reduce the amount of bias current drawn from the input signal at the input terminal of the amplifier without effecting the high frequency response of the amplifier. Other aspects of the present invention include means for modifying the response of the amplifier so as to introduce a zero (a zero being defined as the value of complex frequency at which the transfer function of the circuit becomes zero) so as to mitigate the effects of the 90° phase shift when the stage is used in a particular feedback configuration of the type described herein.

These and other objects of the invention will in part be obvious and will in part appear hereinafter. The invention accordingly comprises the apparatus possessing the construction, combination of elements, and arrangement of parts which are exemplified in the following detailed disclosure and the scope of the application of which will be indicated in the claims.

For a fuller understanding of the nature and objects of the present invention, reference should be had to the following detailed description taken in connection with the accompanying drawings wherein.

In the drawings, the same numerals are used to designate similar or like parts.

Figure 1:
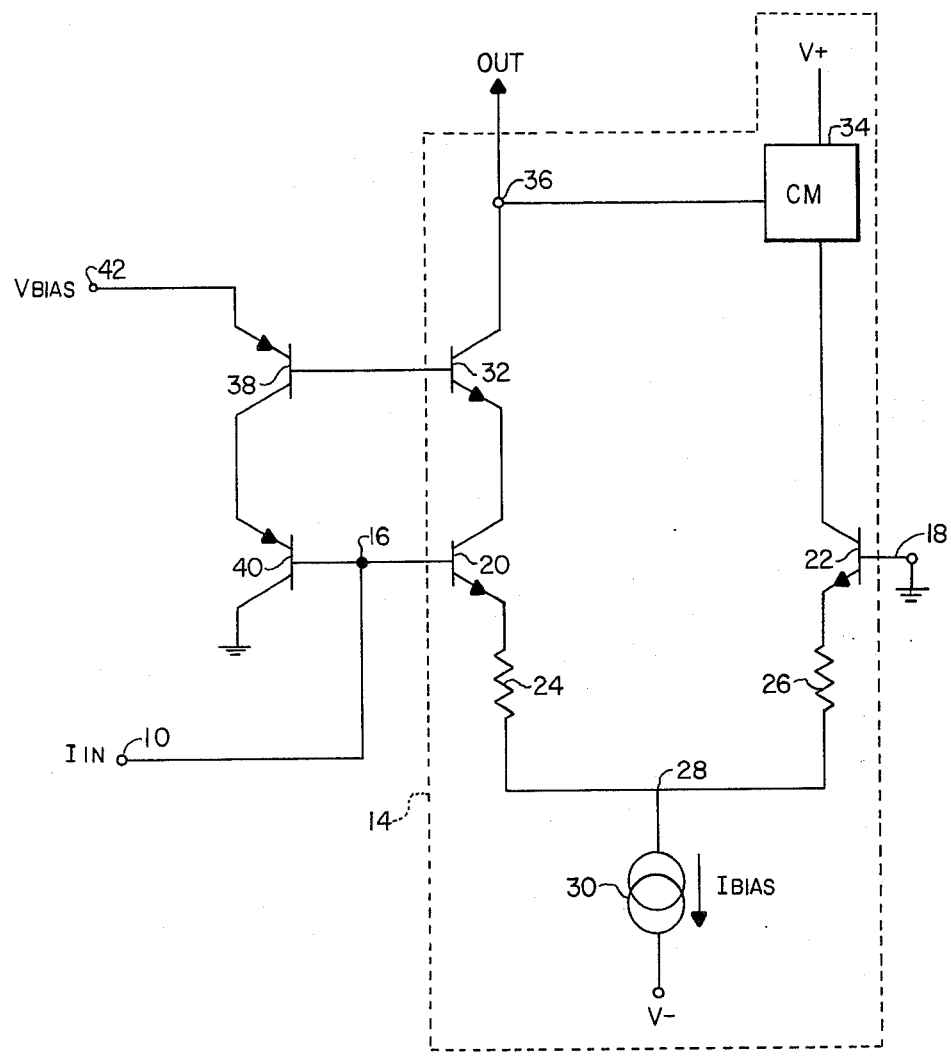
FIG. 1 is a prior art circuit shown partially in schematic form and partially in block form.

Referring to the prior art of FIG. 1, the circuit shown is an input stage having one input grounded. In particular, input terminal 10 of the amplifier 14 is connected to junction 16 which forms an input to the differential pair of transistors 20 and 22, while the other input terminal 18 is connected to system ground. The pair of transistors 20 and 22 have their respective bases connected to the corresponding junction 16 and terminal 18. The transistors 20 and 22 are shown as NPN transistors having their emitters respectively connected through identical resistors 24 and 26 to a junction point 28. The latter is connected to current source 30. The collector of transistor 20 is connected to the emitter of transistor 32, which in turn has its collector connected to the stage output terminal 36 of the amplifier and to the output of current mirror 34. The input of current mirror 34 is connected to the collector of transistor 22.

Transistor 32 and additional transistors 38 and 40 function with transistor 20 to provide a compensating current to the input of the differential amplifier. Transistors 38 and 40 are PNP transistors respectively having their bases connected to the corresponding bases of transistors 32 and 20. The emitter of transistor 38 is connected to a suitable DC voltage source 42, while the other collector is connected to the emitter of transistor 40. The latter in turn has its collector connected to system ground. While the transistors 20, 22 and 32 are shown as NPN transistors and transistors 38 and 40 are shown as PNP transistors, all of transistors can be of an opposite type with those of the same conductivity type having the same current gain (beta) characteristics.

Generally, current source 30 and current mirror 34 function to provide biasing current through both sides of the differential amplifier, i.e. through the collector and emitter of transistors 20 and 32 on the one hand and the collector and emitter of transistor 22 on the other hand. The current of transistor 32 approximately equals the collector current of transistor 20. Since transistors 20 and 32 are ideally matched, the resulting base bias currents of these transistors will be approximately equal. Since the base of transistor 38 is tied to the base of transistor 32 their base currents will be equal. The resulting base current of transistor 38 produces a collector current through this transistor resulting in an approximately equal collector current in transistor 40. Again since transistors 38 and 40 are theoretically matched, the base currents in transistors 40 and 38 will be approximately the same. Since the base of transistor 40 is connected to the base of transistor 20 the base current of transistor 40 will ideally supply the base current of transistor 20. If all transistors of a like conductivity type are matched, the base current needed by transistor 20 will be about that supplied by transistor 40, practically eliminating the need for current to be drawn from terminal 10. Summarizing, therefore, under biasing conditions, the base currents of transistors 20, 32, 38 and 40 are all equal, and the current from the input terminal is theoretically zero. Thus, as long as the operating characteristics of the transistors remain approximately equal, and the base currents all remain equal, the current drawn through junction 16 from the base of transistor 40 to the base of transistor 20, the current drawn from terminal 10 will be much less than that normally required.

More particularly, while the compensating current generated by transistors 20, 32, 38 and 40 theoretically eliminates the need of bias current from terminal 10, a problem can arise if there is a mismatch in the operating characteristics of transistors 20, 32, 38 and 40. In particular, where the base to collector voltages of otherwise matched transistors are operating at different levels, the current gain (beta) of the transistors may vary, related to a phenomenon known as the Early effect. Accordingly, there will not be one hundred percent correction. If one reduces the emitter current of transistor 20 to reduce the input bias current, to bring the mismatch with correction to tolerable levels, one can effect the high frequency performance of the amplifier.

In accordance with the present invention, bipolar transistor means is coupled between input terminal 10 and junction 16 so as to buffer the terminal 10 from junction 16 and so as to reduce the amount of bias currents drawn from the input signal without effecting the high frequency performance of the amplifier.

Figure 2:
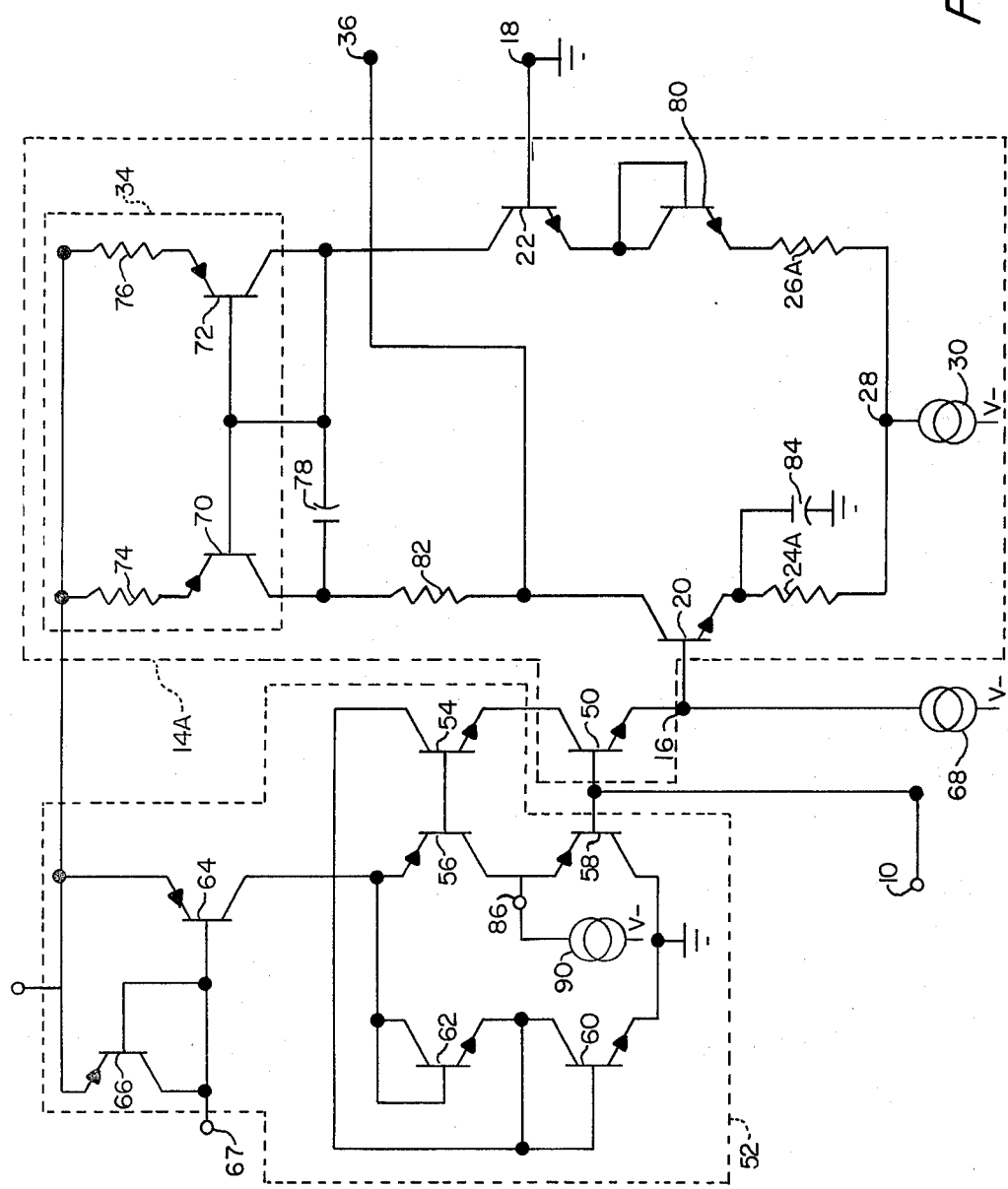
FIG. 2 is a circuit schematic of the preferred embodiment of the amplifier incorporating the principles of the present invention and having one input grounded.

More specifically, referring to FIG. 2, input terminal 10 is connected to the base of bipolar transistor 50. The emitter of transistor 50 is connected to junction 16, while the collector is connected to the modified compensation means 52 for generating a compensating signal to the bipolar transistor 50. Amplifier 14A and compensating means 52 are modifications of the corresponding parts of the FIG. 1 circuit so as to incorporate other aspects and principles of the present invention.

Referring to compensating means 52, the bases of transistors 50 and 58 are connected together. Similarly, the bases of transistors 54 and 56 are tied together. The base of transistor 62 is diode-connected to its collector, and similarly, the base of transistor 60 is diode-connected to its collector. The emitter of transistor 54 is connected to the collector of transistor 50. The emitter of transistor 58 and collector of transistor 56 are tied together, and the emitter of transistor 62 and collector of transistor 60 are connected together. The collector of transistor 54 is connected to the base and collector of transistor 60. The emitter of transistor 60 and collector of transistor 58 are connected together and to system ground. Finally, the collector and base of transistor 62 are connected to the emitter of transistor 56 as well as to a current bias source, the latter including transistors 64 and 66.

Specifically, the collector of transistor 64 is connected to the junction formed by the base and emitter of transistor 62 and emitter of transistor 56 all of which is adapted to be connected through terminal 67 to a suitable current source (not shown). The emitter of transistor 64 is connected to the emitter of transistor 66 and to a bias potential. The base and collector of transistor 66 are tied together and to the base of transistor 64. Transistors 50, 54, 60 and 62 are all NPN transistors matched for their current gain characteristics, and similarly, transistors 56 and 58 are both PNP transistors matched for their current gain characteristics. Junction 16 is suitably connected to a current source 68.

The amplifier generally indicated at 14A is modified from the topology shown in FIG. 1 for reasons which will become more apparent hereinafter. The current mirror 34 of amplifier 14A is shown in greater detail and includes PNP transistors 70 and 72, the bases of which are connected together. The emitters of transistors 70 and 72 are connected through respective resistors 74 and 76 to a bias potential. The base of transistor 70 is connected through capacitor 78 to its collector, while the base of transistor 72 is connected directly to its collector. The collectors of transistors 70 and 72 form respectively the output and input of the current mirror 34.

The collector of transistor 72, which forms the input of mirror 34 is accordingly connected to the collector of transistor 22. The base of transistor 22 is connected to the other amplifier input terminal 18, which in turn is connected to system ground. The emitter of transistor 22 is connected to the added diode-connected transistor 80, the latter being formed by connecting the base and collector of an NPN transistor together, the emitter of the transistor being connected to resistor 26A. The latter is connected to junction point 28, which in turn is connected to the current source 30.

The collector of transistor 70 forms the output of current mirror 34 and is connected through resistor 82 to the stage output terminal 36. The latter is connected to the collector of transistor 20. The emitter of transistor 20 is connected through capacitor 84 to system ground and through resistor 24A to junction point 28.

In operation, by providing the transistor 50 at the amplifier input terminal 10 between the terminal and the differential pair of transistors 20 and 22, the amount of input bias current drawn from the stage input terminal 10 is reduced without effecting high frequency performance of the amplifier. The collector current of transistor 50 which is connected as an emitter follower can operate at a lower magnitude than the collector current of transistor 20 so that a reduction in bandwidth of the amplifier is not required. By operating the collector of transistor 50 in the FIG. 2 embodiment at a lower current than the collector of transistor 20 in the FIG. 1 prior art circuit, a smaller amount of base current flows in the base of the former transistor than in the latter. The base current in transistor 50 then determines the bias current drawn from terminal 10, hence reducing the bias drawn from that terminal. Since the same current through transistor 20 can be provided with less input bias current at terminal 10, the high frequency performance of the stage remains substantially unaffected.

In a typical feedback application terminal 36 will have little current output and terminal 10 will be near ground. The base emitter junction of transistor 50 places the junction 16 one diode drop below ground. The emitter of transistor 20 is therefore two diode drops below ground. Since the input terminal 18 is at system ground, the emitter of transistor 22 is one diode drop below ground. The diode 80 accordingly provides the matching diode drop of the emitter of transistor 20. While a similar diode-connected transistor having its emitter connected to the base of transistor 22 and its collector-base connected to terminal 18 would provide the desired symmetry, it is preferred to add diode-connected transistor 80 between the emitter of transistor 22 and source 30. The latter arrangement provides an advantage over the former due to the fact that the diode-connected transistor 80 when connected to the emitter of transistor 22 helps minimize noise from transistor 22 which would otherwise be provided if the diode-connected transistor was connected to the base of transistor 22. Further, diode-connected transistor 80 is operating at a higher current level then it would be if connected to the base of transistor 20 so as to reduce the effects of noise from the transistor 80.

It will be appreciated that by providing diode-connected transistor 80 as shown, at a desired operating bias current the emitter circuit impedances of the amplifier should be balanced. More particularly, the emitter impedance of transistor 22, plus the diode impedance of transistor 80 and the impedance of resistor 26A should equal the emitter impedance of transistor 20 plus the impedance of resistor 24A. By insuring this balance, any noise generated in current source 30 will be rejected by the balance of the amplifier.

With respect to the compensation means 52, transistors 60 and 62 combine to provide a voltage source for transistor 56. Further, the voltage source for the collector of transistor 54 is provided by the junction of the emitter of transistor 62 and collector of transistor 60. As previously described, transistors 50 and 54 are matched for the current gain characteristics and transistors 56 and 58 are similarly matched. The emitter of transistor 56 is plus 2 Vbe (2 diode drops) above ground because of transistors 62 and 60. The base of transistor 56 is plus one Vbe (1 diode drop) above ground since it is one diode drop below its emitter. This results in the emitter of transistor 54 being approximately at ground. The input node at the base of transistor 50 is also at system ground and the emitter of transistor 58 is therefore plus 1 Vbe (1 diode drop) above ground. As previously mentioned, the current gain of transistors will vary with variations in the base-to-collector voltage of the transistor. If the collector of transistor 54 was tied directly to, say, the positive voltage rail the result would be that the base-to-collector voltage of transistor 54 would differ from the base-to-collector voltage of transistor 50. Accordingly, they would be operating with different design center betas. However, by connecting the collector of transistor 54 to the one Vbe source provided by the diode-connected transistors 60 and 62, transistor's 54 base-collector voltage is set approximately equal to that of transistor 50. The emitter of transistor 56 is tied to the two Vbe source also provided by diode-connected transistors 60 and 62. Thus, the configuration provided by the compensation means 52 of FIG. 2 is an improvement over the configuration provided by transistors 32, 38 and 40 of FIG. 1, since there is a reduction in fluctuations relative to one another in the base currents of the transistors due to the Early effect.

While every effort can be made to match transistors 56 and 58 and match transistors 50 and 54, 60 and 62 for their current gain characteristics, where the circuit is made in accordance with IC techniques, mismatches may occur and 100% compensation will not be provided. Accordingly, a port 86 is provided at the emitter of transistor 58 for accepting an external current source 90. The latter source is provided in order to add or subtract current to the emitter of transistor 58 to provide correction for any transistor mismatching.

In addition to the foregoing, where the amplifier stage is to be used in a feedback configuration such as shown and described in our U.S. Pat. No. 4,377,792, it is desirable to further modify the stage so as to mitigate the effects of the 90° phase shift introduced by a pole in the frequency response which would be provided by capacitor 78 without the resistor 82 (when the collector of transistor 70 is connected directly to the collector of transistor 20). However, by utilizing the resistor 82 at the output of current mirror 34, a zero is introduced in the frequency response at a higher frequency that the pole as is desired to mitigate the effects of the 90° phase shift introduced by the pole.

Further, the differential amplifier 14 of FIG. 1 may provide too much gain. This is resolved by the provision of resistors 24A and 26A as well as the diode 80 as a impedance element which serves to reduce the gain of the amplifier. However, the addition of diode 80 and resistors 24A and 26A at the emitters of transistors 20 and 22 serve to cause emitter degeneration of transistors 20 and 22. This, together with the base-to-emitter parasitic capacitance of transistor 20 creates another pole at relatively high frequencies in the transfer characteristics of the stage. However, by providing capacitor 84 as shown, an additional zero is provided in the transfer characteristics of the stage to overcome the effects of the pole.

Figure 3:
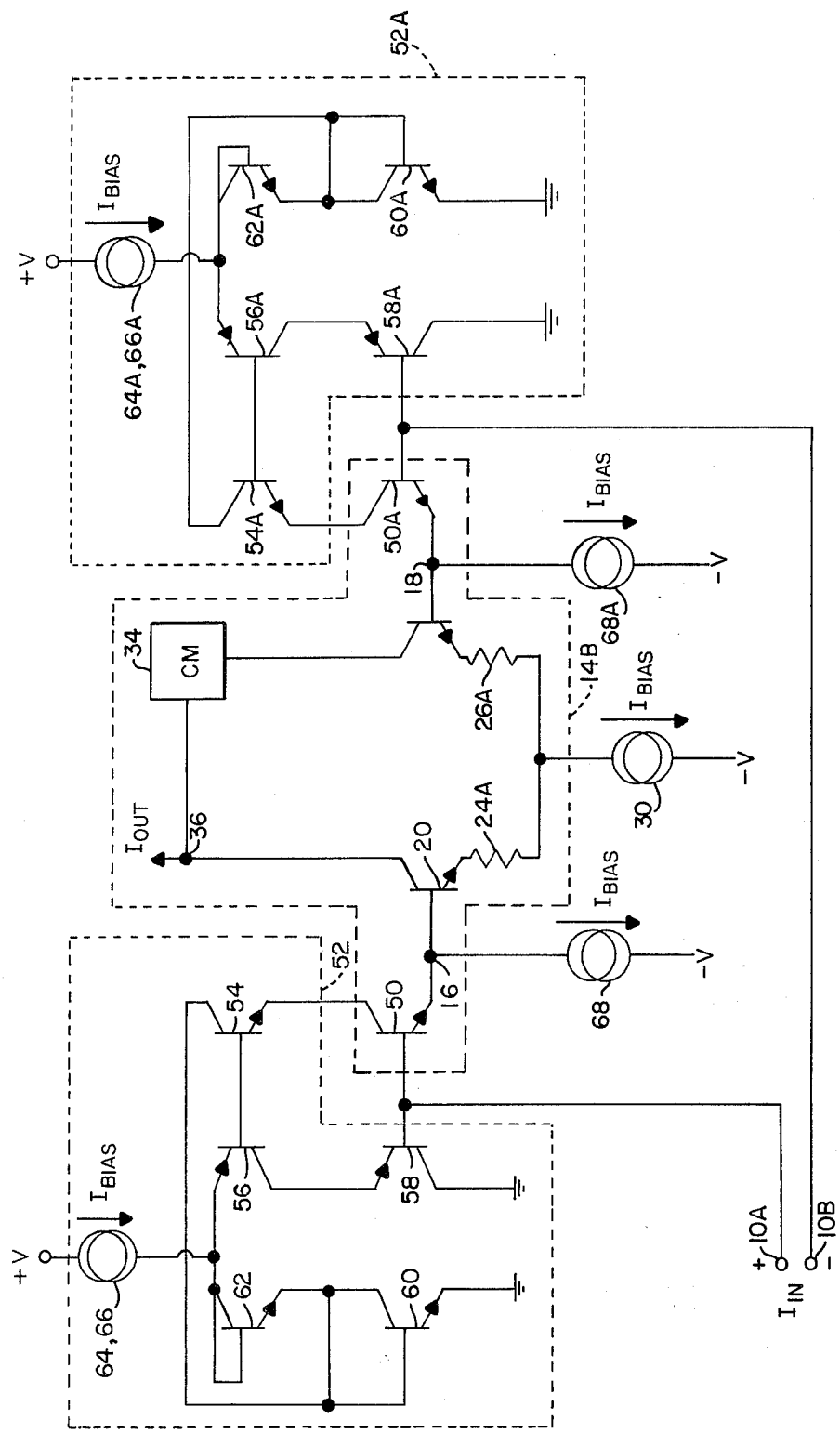
FIG. 3 is a circuit schematic of the preferred embodiment of the differential input stage incorporating the principles of the present invention having both inputs connected to receive an input signal.

The principles of the present invention described with respect to FIG. 2, can also be applied to a differential stage, as shown in the embodiment of FIG. 3.

In particular, positive and negative stage input terminals 10A and 10B are provided for receiving two signals. Terminal 10A is connected to the base of transistor 50 which in turn has its collector connected to the compensation means 52 and its emitter connected to amplifier input terminal 16. Terminal 10A is in turn biased by current source 68. Similarly, the second input terminal 10B is connected to the base of buffer transistor 50A, the latter being identical to transistor 50. Transistor 50A has its collector connected to compensating means 52A, the latter being identical to compensating means 52, and its emitter connected to the amplifier input terminal 18. Terminal 18 is suitably biased by current source 68A. Thus, by virtue of buffer transistor 50A and compensating means 52A, the amount of biasing current required from the input terminal 10B is reduced. Where the junction 16 and terminal 18 are at the same potential with respect to ground, the diode 80 of the amplifier 14A of FIG. 2 can be omitted in amplifier 14B of FIG. 3 and resistors 24A and 26A are of equal impedance value.

The amplifiers of FIG. 2 and FIG. 3 thus described, provide an improvement over the prior art of FIG. 1, since the input biasing currents are reduced without effecting the high frequency performance of the amplifier. The use of bipolar transistors 50 and 50A makes the circuit topology easily adapted for IC implementation. Further, in the FIG. 2 embodiment, the use of capacitor 78 and resistor 82 provide a zero in the transfer characteristics of the amplifier 14A. By connecting the diode 80 to the emitter of transistor 22 and by matching the combined impedance of the emitter circuit of transistor 20 and resistor 24A with the combined impedance of the emitter circuit of transistor 22, diode 80 and resistor 26A, noise contributed by source 30 and transistor 80 is reduced. Finally, the addition of capacitor 84 introduces a zero in the transfer characteristics of the amplifier and the stage which will mitigate the effects of the pole introduced by resistors 24A, 26A and transistors 80, and the base-to-emitter parasitic capacitance of transistor 20.

Since certain changes may be made in the above apparatus without departing from the scope of the invention herein involved, it is intended that all matter contained in the above description or shown in the accompanying drawing shall be interpreted in an illustrative and not in a limiting sense.

What is claimed is:

1. In an amplifier of the type comprising at least two input terminals and a differential pair of transistors, at least one input terminal being adapted to receive an input signal and said differential pair of transistors including first and second bipolar transistors, said first transistor being coupled to system ground, wherein the improvement comprises:

bipolar transistor means comprising a third bipolar transistor having a base, emitter and collector, said base of said third transistor being coupled to said one input terminal and said emitter of said third transistor being coupled to said second transistor so as to buffer said one input terminal from said differential pair; and compensation means for generating a compensating current to said bipolar transistor means, said collector of said third bipolar transistor being coupled to said compensation means so as to operate as an emitter follower, said compensation means comprising fourth, fifth and sixth bipolar transistors, each of said fourth, fifth and sixth transistors having a base, collector and emitter, said base of said fourth transistor being coupled to the base of said third transistor, said collector of said fourth transistor being coupled to system ground and said emitter of said fourth transistor being coupled to the collector of said sixth bipolar transistor, said emitter of said fifth transistor being coupled to the collector of said third bipolar transistor and said collector of said fifth transistor being coupled to a predetermined voltage source; and said emitter of said sixth bipolar transistor is adapted to be coupled to a preselected voltage source; and means for reducing DC voltage offset between the bases of said differential pair, said means for reducing said voltage offset comprising diode means coupled to the emitter of said first transistor, a first resistance means coupling said diode means to a junction point, and a second resistance means coupling the emitter of said second transistor to said junction point, wherein the values of said first and second resistors are set to reduce the noise through said differential pair;

wherein said bipolar transistor means and said compensation means are adapted to reduce the amount of bias signal drawn from said input signal by said differential pair than would be otherwise drawn by said differential pair if said one input terminal were directly connected to said differential pair.

2. An amplifier according to claim 1, wherein the other of said input terminals is connected to system ground.

3. An amplifier according to claim 1, wherein said predetermined voltage source is one diode drop above ground and said preselected voltage source is two diode drops above ground.

4. An amplifier according to claim 3, further including means for correcting for mismatches in the current gain characteristics of said third, fourth, fifth and sixth transistors.

5. An amplifier according to claim 4, wherein said means for correcting for mismatches includes means for applying current to the emitter of said fourth transistor and the collector of said sixth transistor.

6. An amplifier according to claim 1, wherein said diode means, said first and second resistance means and said fourth bipolar transistor provide a pole at a predetermined frequency in the transfer characteristics of said amplifier, and said amplifier further includes means for providing a zero in said transfer characteristics at a frequency near said predetermined frequency.

7. An amplifier according to claim 6, wherein said means for providing said zero includes capacitive means coupled between the emitter of said second bipolar transistor and system ground.

8. An amplifier according to claim 1, further including a current mirror including a pair of transistors having their bases coupled together and their emitters adapted to be coupled to a common source of voltage, a capacitor connected between the base and collector of one of said pair and the base and collector of the other of said pair being connected together, said capacitor providing a pole at a predetermined frequency in the transfer characteristics of said stage, said amplifier further including means for providing a zero in said transfer characteristics at a frequency above said predetermined frequency.

9. An amplifier according to claim 8, wherein said means for providing a zero includes resistive means coupled to the collector of said one of said pair of said transistors.

10. In a differential amplifier of the type comprising (a) a current mirror including a pair of transistors having their bases connected to one another and adapted to be forward biased by a bias voltage source, each of said pair of transistors having an output, and (b) two differential transistors each respectively coupled to the output of a different one of said pair of transistors so as to receive the output of said one of said pair of transistors and coupled to one another at a common junction so as to form a differential pair, the improvement comprising:

a capacitive element connected between the base of one of said pair of transistors and its output, the base of the other of said pair of transistors being connected directly to its output so as to provide a pole in the transfer characteristics of said amplifier at a predetermined frequency, and means for providing a zero in said transfer characteristic near said predetermined frequency.

11. An amplifier according to claim 10, wherein said means for providing said zero includes a resistor coupled to the output of said one of said pair of transistors.

* * * * *

UNITED STATES PATENT AND TRADEMARK OFFICE
CERTIFICATE OF CORRECTION

PATENT NO. : 4,425,551

DATED : January 10, 1984

INVENTOR(S) : David E. Blackmer et al

It is certified that error appears in the above-identified patent and that said Letters Patent is hereby corrected as shown below:

Claim 1, column 7, line 42, before "input" insert -- of said --; and

Claim 1, column 7, line 42, delete "terminal" and substitute therefor -- terminals --.

Signed and Sealed this

Twentieth Day of March 1984

[SEAL]

Attest:

GERALD J. MOSSINGHOFF

Attesting Officer

Commissioner of Patents and Trademarks